(12) United States Patent
Dadvand (10) Patent No.: US 12,476,173 B2
(45) Date of Patent: Nov. 18, 2025

(54) ELECTRONIC DEVICE WITH POST MOLD PLATED NICKEL TUNGSTEN AND TIN BILAYER FOR IMPROVED BOARD LEVEL RELIABILITY

(71) Applicant: Texas Instruments Incorporated, Dallas, TX (US)

(72) Inventor: Nazila Dadvand, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 395 days.

(21) Appl. No.: 18/308,956

(22) Filed: Apr. 28, 2023

(65) Prior Publication Data

US 2024/0363504 A1     Oct. 31, 2024

(51) Int. Cl.
| | |
|---|---|
| *H01L 23/495* | (2006.01) |
| *H01L 21/56* | (2006.01) |
| *H01L 23/00* | (2006.01) |
| *H01L 23/31* | (2006.01) |

(52) U.S. Cl.
CPC ...... *H01L 23/49582* (2013.01); *H01L 21/565* (2013.01); *H01L 23/3107* (2013.01); *H01L 23/4951* (2013.01); *H01L 23/4952* (2013.01); *H01L 23/49541* (2013.01); *H01L 23/49575* (2013.01); *H01L 24/48* (2013.01); *H01L 2224/48247* (2013.01)

(58) Field of Classification Search
CPC ............. H01L 23/49582; H01L 21/565; H01L 23/3107; H01L 23/4951; H01L 23/4952; H01L 23/49541; H01L 23/49575; H01L 24/48; H01L 2224/48247
See application file for complete search history.

(56) References Cited

U.S. PATENT DOCUMENTS

| | | | |
|---|---|---|---|
| 3,917,464 A | 11/1975 | Pearlstein | |
| 10,957,637 B2 | 3/2021 | Dadvand | |
| 2004/0183166 A1* | 9/2004 | Abbott | ................ H01L 23/3107 |
| | | | 257/E23.054 |
| 2007/0209834 A1 | 9/2007 | Kuan et al. | |
| 2014/0021465 A1 | 1/2014 | Facchetti et al. | |
| 2016/0359097 A1 | 12/2016 | Kunhara | |
| 2017/0005058 A1 | 1/2017 | Hurwitz | |

(Continued)

FOREIGN PATENT DOCUMENTS

| | | |
|---|---|---|
| CN | 105951135 B | 3/2019 |
| JP | 2009060010 A | 3/2009 |

OTHER PUBLICATIONS

PCT International Search Report mailed Apr. 29, 2024, 3pgs.

*Primary Examiner* — Victor A Mandala
(74) *Attorney, Agent, or Firm* — Ronald O. Neerings; Frank D. Cimino (57) ABSTRACT

An electronic device includes a semiconductor die, a package structure enclosing the semiconductor die, and a conductive lead having first and second surfaces. The first surface has a bilayer exposed along a side of the package structure, and the second surface is exposed along another side of the package structure. The bilayer includes first and second plated layers, the first plated layer on and contacting the first surface of the conductive lead and the second plated layer on and contacting the first plated layer and exposed along the side of the package structure, where the first plated layer includes nickel tungsten, and the second plated layer includes tin.

20 Claims, 7 Drawing Sheets

(56) References Cited

U.S. PATENT DOCUMENTS

| | | |
|---|---|---|
| 2020/0286844 A1 | 9/2020 | Johnson et al. |
| 2021/0210419 A1 | 7/2021 | Dadvand |
| 2022/0059423 A1 | 2/2022 | Manack et al. |
| 2022/0077031 A1* | 3/2022 | Jeon ................... H01L 23/49548 |
| 2022/0208665 A1* | 6/2022 | Dadvand ............. H01L 21/4835 |
| 2023/0114872 A1* | 4/2023 | Dadvand ............. H01L 21/4821 |
| | | 257/677 |
| 2023/0298982 A1* | 9/2023 | Dadvand ........... H01L 23/49582 |
| | | 257/677 |
| 2025/0006510 A1* | 1/2025 | Fu ........................... H01L 24/48 |
| 2025/0218886 A1* | 7/2025 | Manack .............. H01L 23/4952 |

\* cited by examiner

ELECTRONIC DEVICE WITH POST MOLD PLATED NICKEL TUNGSTEN AND TIN BILAYER FOR IMPROVED BOARD LEVEL RELIABILITY

BACKGROUND

Copper integrated circuit leads can be tin plated to mitigate deterioration of the material properties and enhance shelf life prior to soldering to a printed circuit board. However, tin plating of bare copper leads can impact board level reliability (BLR) of an electronic system by cracking and material defects at the solder joint of integrated circuit leads and solder pads of a printed circuit board. In addition, thermal dissipation through die attach structures is important for mitigating degradation and enhancing operation of electronic devices at high temperatures for compact and more highly integrated systems having smaller features and higher currents.

SUMMARY

In one aspect, an electronic device includes a semiconductor die, a package structure enclosing the semiconductor die, and a conductive lead having a first surface and a second surface, the first surface having a bilayer exposed outside the package structure along a side of the package structure, and the second surface exposed outside the package structure along another side of the package structure, the bilayer including a first plated layer and a second plated layer, the first plated layer on and contacting the first surface of the conductive lead, the second plated layer on and contacting the first plated layer and exposed outside the package structure along the side of the package structure, the first plated layer including nickel tungsten, and the second plated layer including tin.

In another aspect, a system includes a circuit board and an electronic device. The electronic device includes a semiconductor die, a package structure enclosing the semiconductor die, and a conductive lead electrically coupled to a circuit of the semiconductor die and to a conductive feature of the circuit board. The conductive lead has a first surface and a second surface, the first surface having a bilayer exposed outside the package structure along a side of the package structure, and the second surface exposed outside the package structure along another side of the package structure, the bilayer including a first plated layer and a second plated layer, the first plated layer on and contacting the first surface of the conductive lead, the second plated layer on and contacting the first plated layer and exposed outside the package structure along the side of the package structure, the first plated layer including nickel tungsten, and the second plated layer including tin.

In a further aspect, a method of fabricating an electronic device includes: performing a first plating process that forms a first plated layer on a first surface of a conductive lead exposed along a side of a molded structure in a panel array of prospective electronic devices, the first plated layer including nickel tungsten; performing a second plating process that forms a second plated layer on the first plated layer, the second plated layer including tin; and performing a package separation process that separates an electronic device from the panel array, with the conductive lead exposed along the side of a respective package structure, the package separation process exposing a second surface of the conductive lead along a first side of the package structure.

DETAILED DESCRIPTION

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Unless otherwise stated, "about," "approximately," or "substantially" preceding a value means+/−10 percent of the stated value. Modifications are possible in the described examples, and other implementations are possible, within the scope of the claims.

Figure 1:
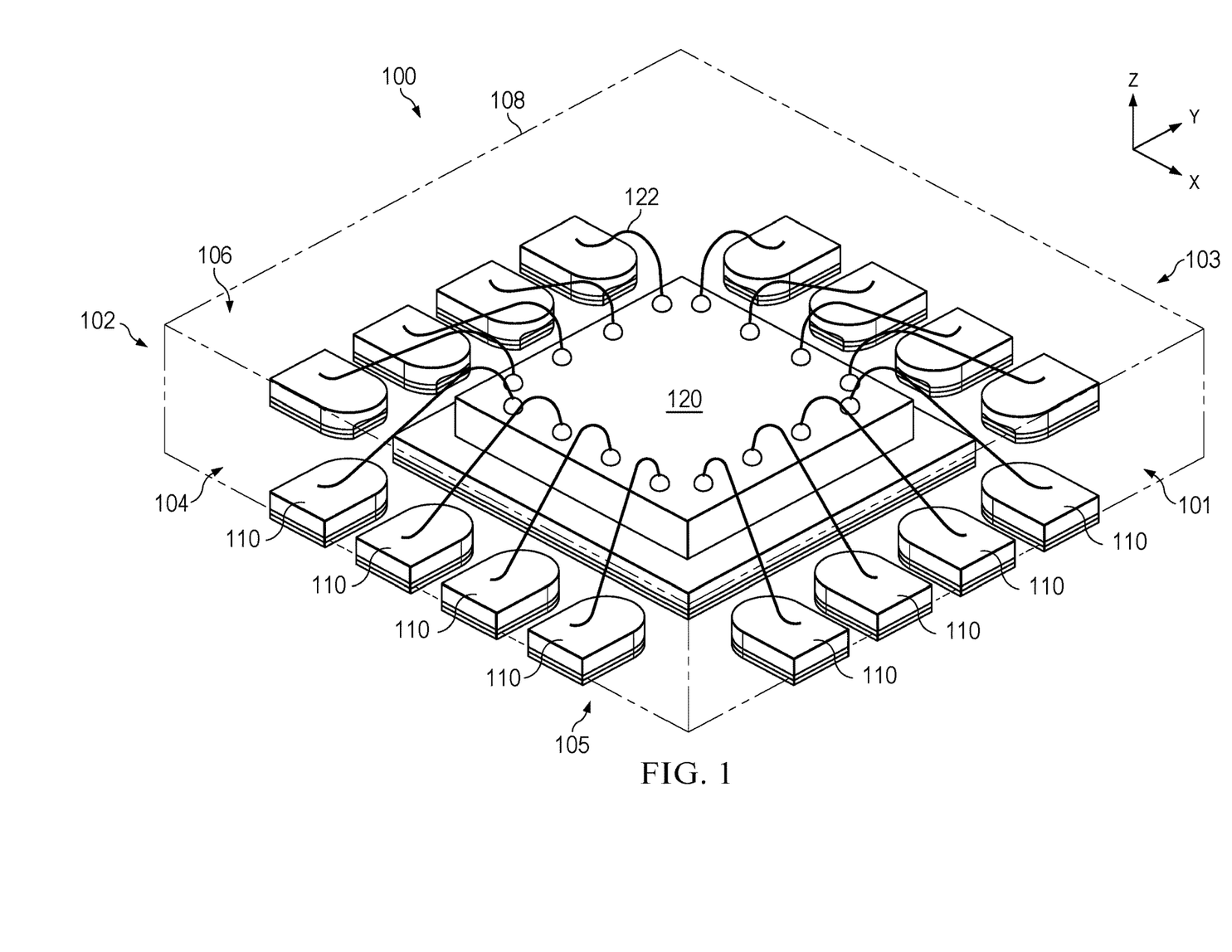
FIG. 1 is a perspective view of an electronic device.
Figure 1A:
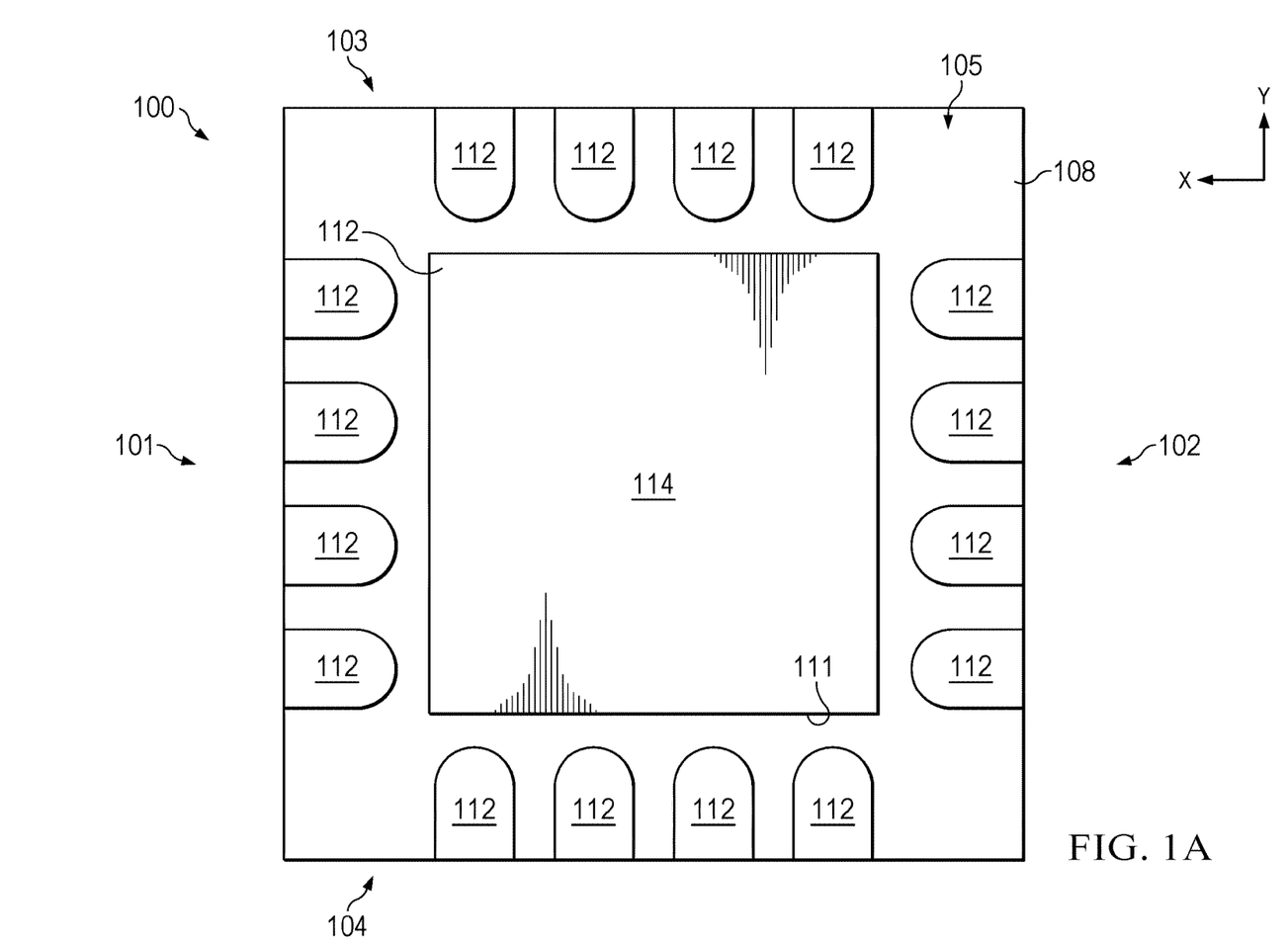
FIG. 1A is a bottom view of the electronic device of FIG. 1.
Figure 1B:
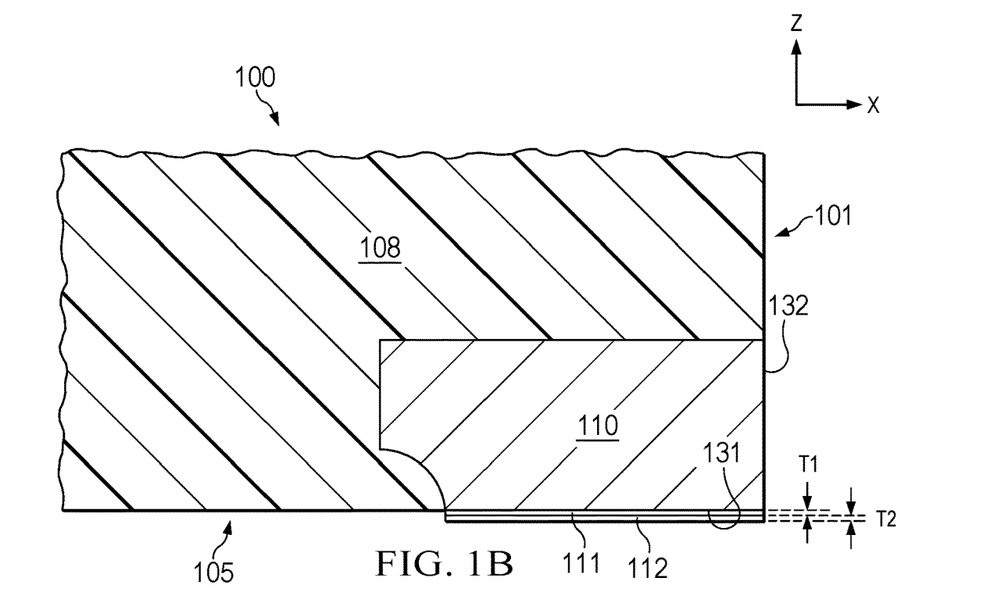
FIG. 1B is a partial sectional side elevation view of the electronic device of FIGS. 1 and 1A.

FIGS. 1-1B show an electronic device 100 with conductive (e.g., copper) leads electroplated after molding with nickel tungsten and tin to improve BLR performance with minimized defect and larger grain sizes that provides a diffusion barrier layer against interdiffusion of copper and tin. Electroplated nanostructure of the nickel tungsten alloy (e.g., $Ni_xW_y$ of any suitable stoichiometry, such as where x is approximately equal to y) with minimized defects and compact structure is an outstanding diffusion barrier layer against interdiffusion of copper (Cu) and tin (Sn). The formation of inter-metallic compounds (IMCs) such as $Cu_3Sn$ and $Cu_6Sn_5$ is decelerated resulting in higher BLR performance as nickel tungsten and copper have very low solubility in each other. Moreover, the nickel tungsten-tin intermetallic has high fracture toughness and high ductility resulting in solder voiding at the interface and reduced chance of cracking at the interface of nickel tungsten-copper IMC to matte plated tin. Described examples enable conductive (e.g., copper) integrated circuit leads to be tin plated to mitigate deterioration of the material properties and enhance shelf life prior to soldering to a printed circuit board while improving BLR of an electronic system once the electronic device is soldered to a host printed circuit board.

The electronic device 100 of FIGS. 1-1B is shown in an example position in a three-dimensional space with a first direction X, a perpendicular (orthogonal) second direction Y (FIG. 1A), and a third direction Z (FIGS. 1 and 1B) that is perpendicular (orthogonal) to the respective first and second directions X and Y. Structures or features along any two of these directions are orthogonal to one another. As best shown in FIG. 1, the electronic device 100 has opposite first and second (e.g., bottom and top) sides 101 and 102, respectively, which are spaced apart from one another along the third direction Z. The electronic device 100 has opposite first and second sides 101 and 102 that are spaced apart from one another along the first direction X and extend along the second direction Y. The electronic device 100 also includes third and fourth sides 103 and 104 spaced apart from one another along the second direction Y, as well as a bottom side 105, and a top side 106 that is spaced apart from the bottom side 105 along the third direction Z. The electronic device 100 has a molded package structure 108 that forms the device sides 101-106. In the illustrated example, the respective sides 101-106 are generally planar and the sides 105 and 106 extend in respective X-Y planes of the first and second directions X and Y. The sides 101-106 in one example have substantially planar outer surfaces. In other examples (not shown), one or more of the sides 101-106 have curves, angled features, or other non-planar surface features.

The electronic device 100 includes conductive leads 110 along the lateral sides 101-104 to form a quad flat no-lead (QFN) package structure. In another implementation the device has conductive leads on two opposite sides to provide a dual flat no-lead (DFN) package structure (not shown). In one example, the conductive leads 110 are or include copper (Cu). As best shown in FIG. 1B, the individual conductive leads 110 have a first (e.g., bottom) surface 131 and a second surface 132 (e.g., a lateral side surface).

The first surface 131 of the illustrated portion in FIG. 1B has a bilayer 111, 112 exposed outside the package structure 108 along the bottom side 105 of the package structure 108. The second surface 132 is exposed outside the package structure 108 along the first side 101 of the package structure 108. The bilayer includes a first plated layer 111 and a second plated layer 112. The first plated layer 111 is on and contacting the first surface 131 of the conductive lead 110. The first plated layer 111 includes nickel tungsten. In one example, the first layer 111 has a thickness along the third direction Z of approximately 0.1 µm or more and approximately 2.0 µm or less. In this or another example, the first plated layer 111 has a thickness along the third direction Z of approximately 0.5 µm or more and approximately 2.0 µm or less. In these or other examples, the first plated layer 111 has a thickness along the third direction Z of approximately 1.0 µm.

The second plated layer 112 is on and contacting the first plated layer 111 and the second plated layer 112 is exposed outside the package structure 108 along the bottom side 105 of the package structure 108. In the above or other examples, the second plated layer 112 has a thickness along the third direction Z of approximately 3.0 µm or more and approximately 12.0 µm or less. The second plated layer 112 includes tin, for example, matte tin with a dull finish, such as formed by electroless plating processing as described further below in connection with FIG. 2.

FIG. 1B shows a partial sectional view of an example conductive lead 110 along the first side 101 of the electronic device 100. The conductive leads on the other lateral sides 102-104 of the electronic device 100 are similarly constructed and have second surfaces 132 extending along respective ones of the lateral sides 101-1-4 of the electronic device 100.

As shown in FIG. 1, the electronic device 100 also includes a semiconductor die 120 enclosed by the package structure 108. The semiconductor die 120 has conductive bond pads electrically connected to respective leads 110 by bond wires 122 and includes one or more circuit components (e.g., transistors, diodes, resistors, etc.) formed on or in a semiconductor layer of the semiconductor die 120.

The semiconductor die 120 can also include a single or multilevel metallization structure with conductive metal interconnections to the component or components of the semiconductor layer, where one or more further components (e.g., inductors, transformers, resistors, capacitors, etc.) can be formed in whole or in part in the metallization structure. One or more of the conductive leads 110 are electrically coupled to a circuit or component of the semiconductor die 120, for example, by a respective bond wire 122 to provide external connectivity for a circuit of the electronic device 100 to a host system (e.g., a circuit board), as described further below in connection with FIG. 9.

Figure 2:
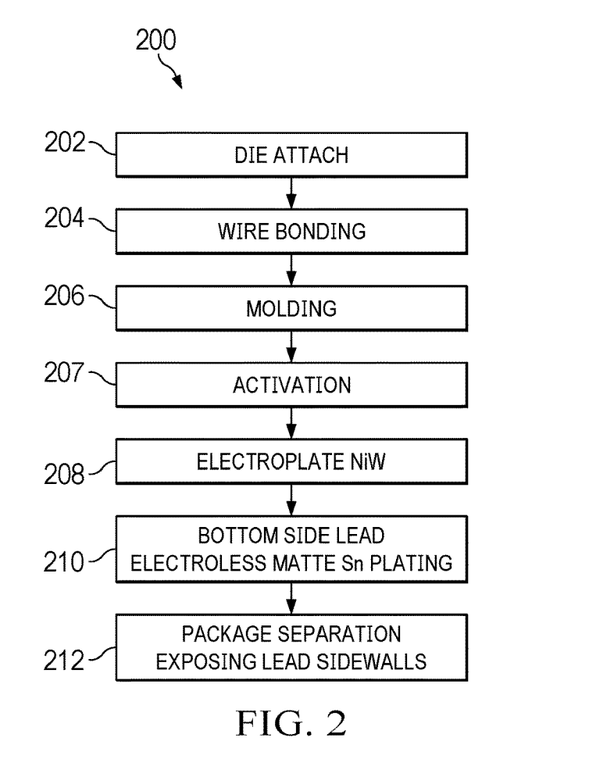
FIG. 2 is a flow diagram of a method of fabricating an electronic device.
Figure 3:
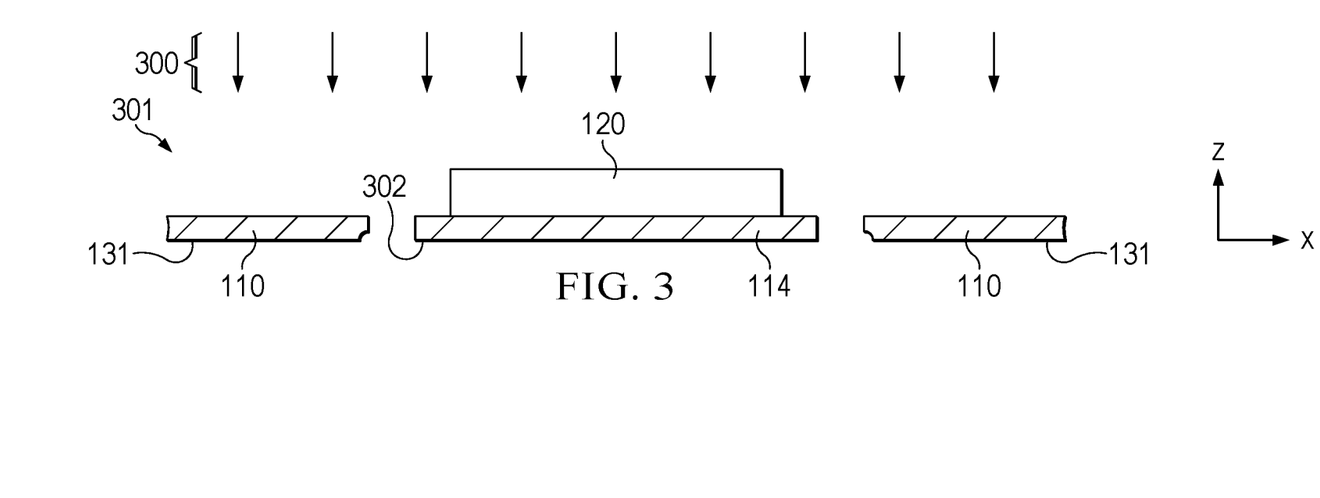
FIGS. 3-8 are partial sectional side elevation views of the electronic device of FIGS. 1-1B undergoing fabrication processing according to the method of FIG. 2.

FIG. 2 shows a method 200 of fabricating an electronic device and FIGS. 3-8 show the electronic device 100 undergoing fabrication processing according to the method 200. The method 200 includes die attach processing at 202. FIG. 3 shows one example, in which a die attach process 300 is performed that attaches the semiconductor die 120 to a die attach pad 114 of a starting lead frame panel array or strip (e.g., copper) that also includes the prospective leads 110. The die attach pad 114 has a lower surface 302 and the leads 110 have lower first surfaces 131 as shown in FIG. 3. In one example, the starting lead frame has multiple prospective device sections or unit areas arranged in a panel array 301 of rows and columns (not shown) of prospective electronic devices 100. The die attach process 300 includes concurrent or sequential placement and attachment of multiple semiconductor dies 120 to respective die attach pads 114 of the panel array 301, for example, using an epoxy or other suitable die attach adhesive (not shown), and optionally including a thermal, UV, or other suitable curing step.

Figure 4:
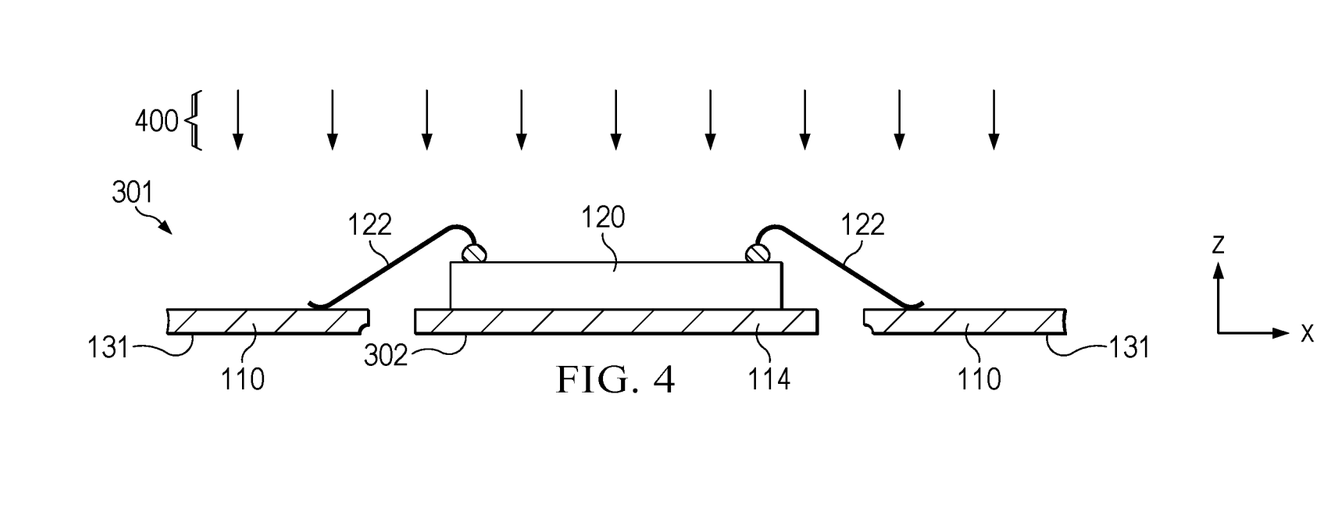

The method 200 continues at 204 with formation of electrical connections including electrically coupling one or more conductive terminals (e.g., bond pads) of the die 120 to respective conductive leads 110, as well as any die-to-die connections required for a given electronic device design (e.g., die-to-die connections for a multiple chip module or MCM device, not shown). FIG. 4 shows one example, in which a wire bonding process 400 is performed that forms bond wires 122 between respective conductive bond pads of the semiconductor die 120 and associated ones of the conductive leads 110 of the starting lead frame in the panel array 301.

Figure 5:
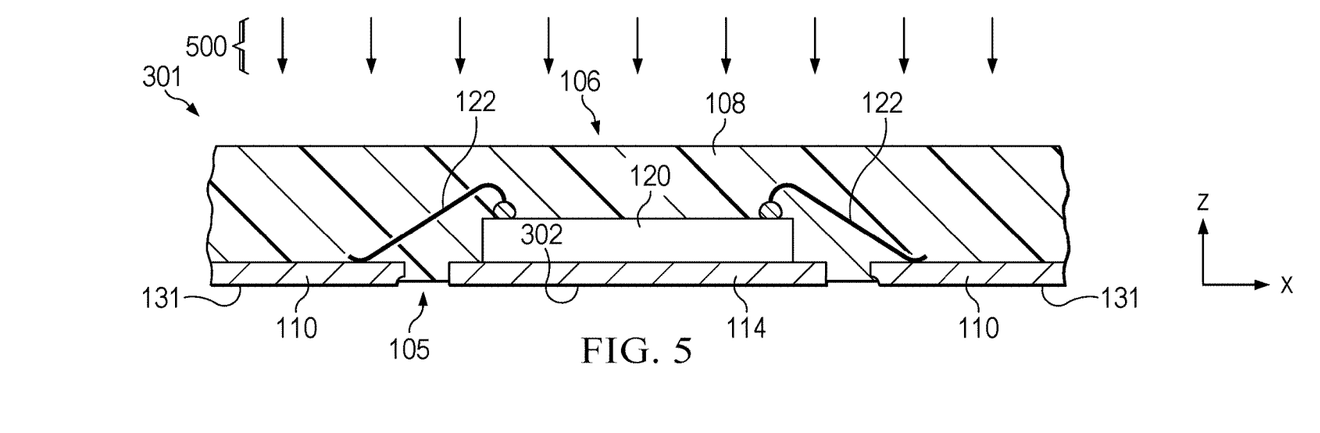

The method 200 also includes performing a molding process at 206 that forms a molded package structure 108 that encloses the semiconductor die 120 and the bond wires 122. FIG. 5 shows one example, in which a molding process 500 is performed that forms the molded package structure 108 that encloses the semiconductor die 120 and the bond wires 122. In the illustrated example, the molding process 500 exposes the lower surfaces 302 of the respective die attach pads 114. In other example, the molded package structure 108 covers the lower surfaces 302 of the respective die attach pads 114, and the lower die attach pad surfaces 302 are not subsequently plated.

The method 200 includes plating to form the bilayer 111, 112 described above in connection with FIGS. 1-1B. In one implementation, the method 200 includes an optional activation step at 207 in FIG. 2 after molding at 106 and before plating processing. In one example, an activation process is performed on the lead frame panel array 301 with the bottom surfaces 131 of the leads 110 and the lower surfaces 302 of the respective die attach pads 114 exposed outside the molded package structure 108. In one implementation, the activation process on the first surfaces 131 of the conductive leads 110 and the lower surfaces 302 of the respective die attach pads 114 using methane sulfonic acid at approximately 10% volume in water. The activation step at 207 can be omitted in other implementations of the method 200.

Figure 6:
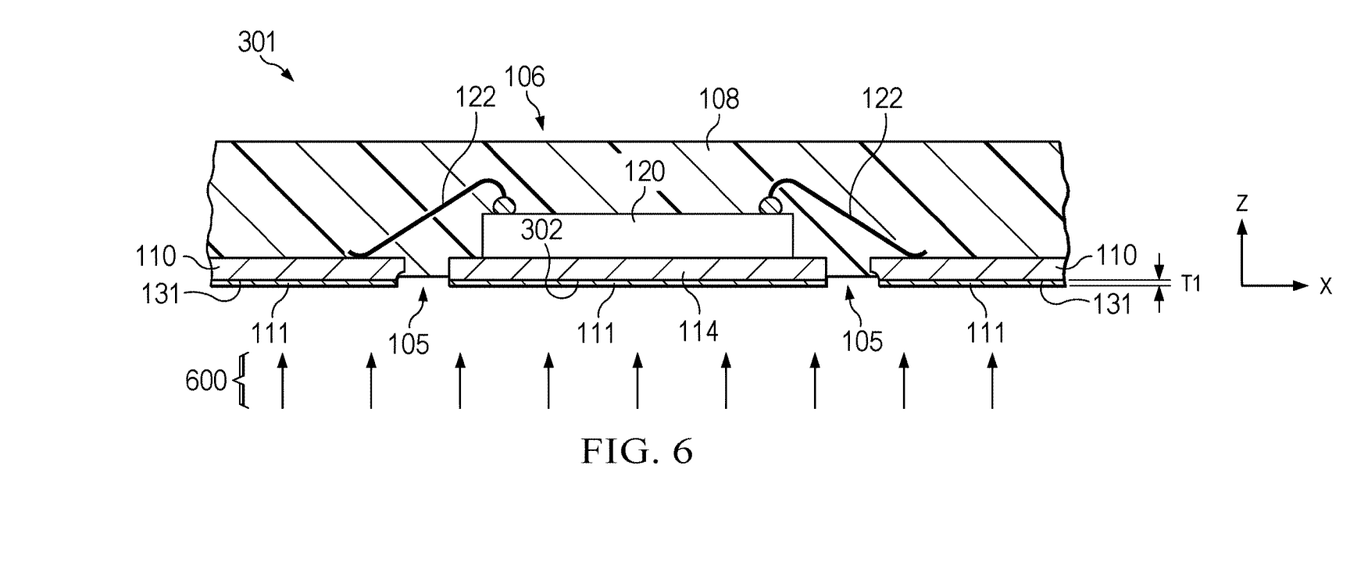

At 208, the method 200 includes performing a first plating process to plate the first surface 131 of the conductive leads 110 with a first plated layer 111 that includes nickel tungsten. FIG. 6 shows one example, in which a first plating process 600 is performed that forms the first plated layer 111 on the first surfaces 131 of a conductive leads 110 exposed along the bottom side 105 of the molded structure 108 in the panel array 301 of prospective electronic devices 100. In the illustrated example, the first plating process 600 concurrently forms the first plated layer 111 on the lower surfaces 302 of the respective die attach pads 114 exposed along the bottom side 105 of the molded structure 108 in the panel array 301.

The first plating process 600 in one example is an electroplating process that forms the first plated layer 111 to a thickness of approximately 0.1 µm or more and approximately 2.0 µm or less on the exposed first surfaces 131 of the conductive leads 110, where the first plated layer 111 includes nickel tungsten. In one implementation, the first plating process 600 in one example is an electroplating process that forms the first plated layer 111 to a thickness along the third direction Z of approximately 0.5 µm or more and approximately 2.0 µm or less. In these or other examples, the first plating process 600 forms the first plated layer 111 to a thickness along the third direction Z of approximately 1.0 µm.

Figure 7:
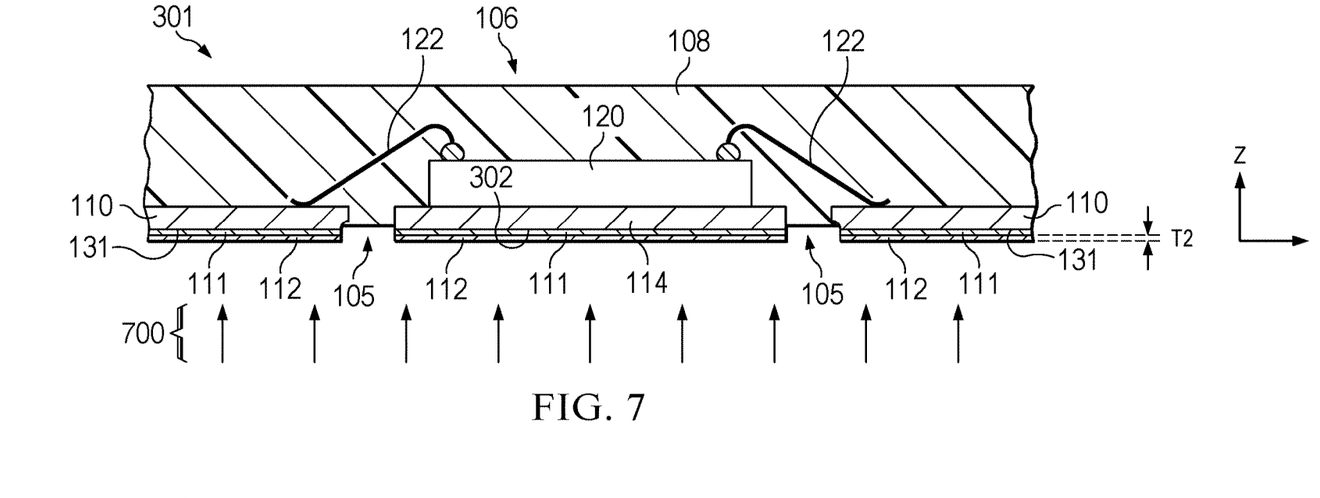

The method 200 continues with matte tin plating at 210. FIG. 7 shows one example, in which a second plating process 700 is performed that forms the second plated layer 112 on the first plated layer 111, where the second plated layer 112 includes tin. In one example, the second plating process 700 is an electroless plating process that forms the second plated layer 112 on the first plated layer 111. The second plated layer 112 is on and contacting the first plated layer 111 and the second plated layer 112 is exposed outside the package structure 108 along the bottom side 105 of the package structure 108. In the illustrated example, the plating at 208 and 210 forms a bilayer 111, 112 on the lower surfaces 302 of the respective die attach pads 114 exposed along the bottom side 105 of the molded structure 108 in the panel array 301. In the above or other examples, second plating process 700 forms the second plated layer 112 to a thickness along the third direction Z of approximately 3.0 µm or more and approximately 12.0 µm or less. The second plated layer 112 includes tin, for example, matte tin with a dull finish, such as formed by electroless plating processing at 210.

Figure 8:
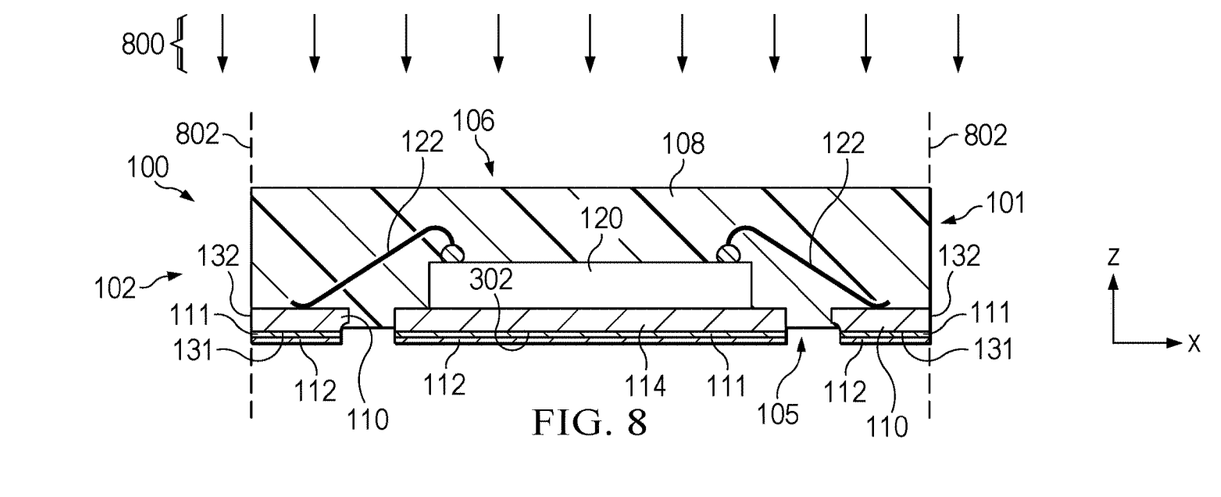

The method 200 continues with package separation at 212 in FIG. 2. FIG. 8 shows one example, in which a package separation process 800 is performed that separates an electronic device 100 from the panel array 301, for example, by saw cutting, laser cutting, or other suitable processing along lines 802. The separation process 800 separates the individual semiconductor device 100 with the nickel tungsten and tin-plated surface 131 of the conductive lead 110 exposed along the bottom side 105 of a respective package structure 108. The package separation process 800 exposes the second surfaces 132 of the conductive leads 110 along the sides 101-104 of the package structure 108.

Figure 9:
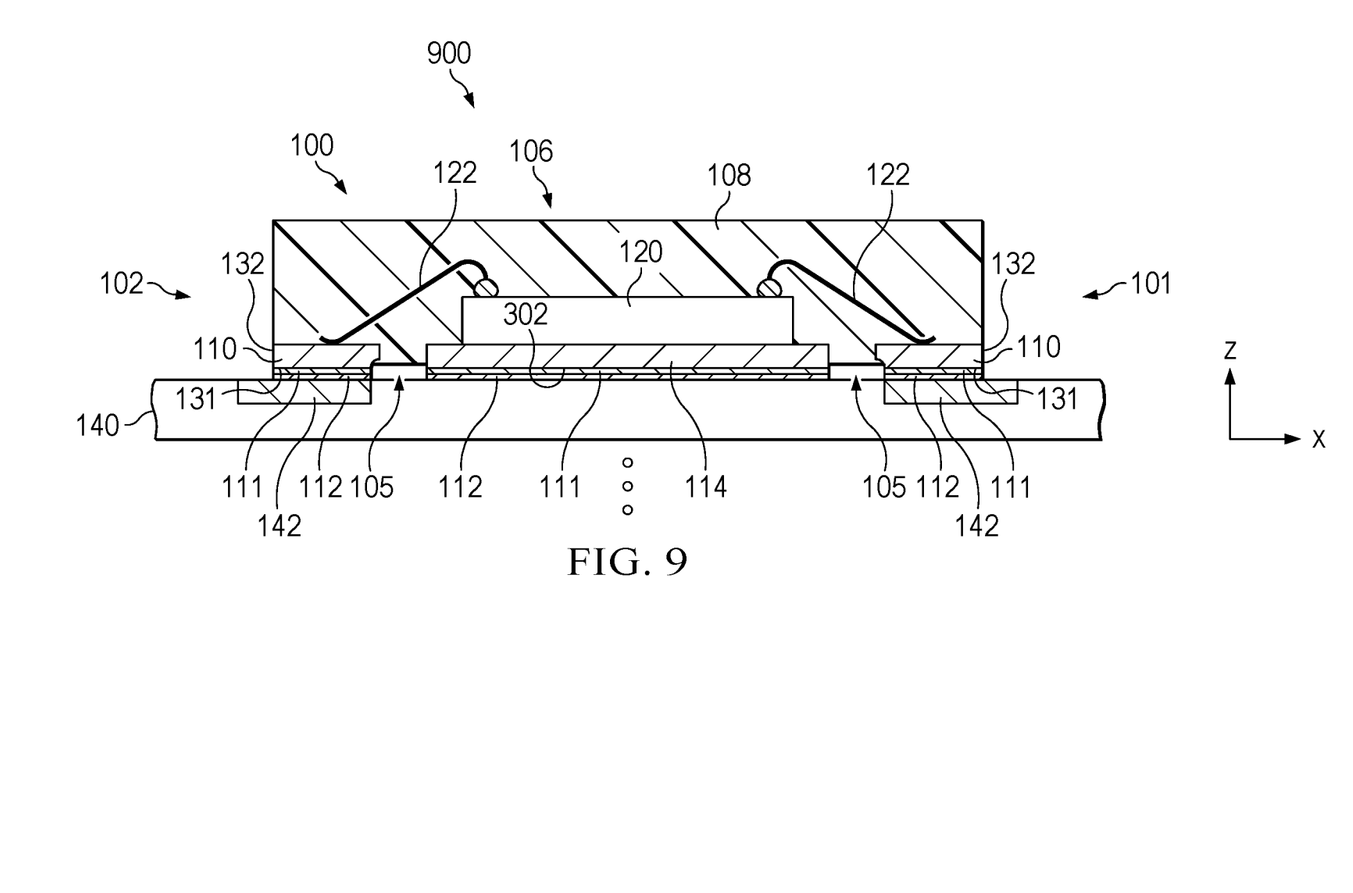
FIG. 9 is a system diagram of a system including the electronic device of FIGS. 1-1B.

FIG. 9 shows a system 900 including the electronic device 100 of FIGS. 1-1B. The system 900 includes an instance of the electronic device 100 installed on a circuit board 140 with one or more of the bilayer plated conductive leads 110 electrically coupled to a circuit of the semiconductor die 110 and to a conductive feature 142 of the circuit board 140. In the illustrated example, the conductive leads 110 are individually soldered to corresponding pads or other conductive features 142 on the top side of the circuit board 140 using solder (not shown), In another implementation, the electronic device is installed in a socket (not shown) of the circuit board 140. The post molding plating at 208 (FIG. 2) of the exposed first surfaces 131 of the conductive leads 110 with the underlayer 111 that includes nickel tungsten prior to plating of matte tin at 210 improves the board level reliability (BLR) performance of the device 100 as installed on the circuit board 140 of the system 900 by reducing defects and including larger grain sizes that provide a diffusion barrier layer against interdiffusion of copper and tin in the subsequent tin plating at 210.

As soldered to the circuit board 140, the presence of the nickel tungsten in the first plated layer 111 decelerates the formation of crack susceptible inter-metallic compounds (IMCs) such as $Cu_3Sn$ and $Cu_6Sn_5$ in the bilayer resulting in higher BLR performance since nickel tungsten and copper have very low solubility in each other. Moreover, the nickel tungsten-tin intermetallic has high fracture toughness and high ductility resulting in solder voiding at the interface and reduced chance of cracking at the interface of nickel tungsten-copper IMC to the matte plated tin. Described examples enable copper integrated circuit leads to be tin plated to mitigate deterioration of the material properties and enhance shelf life prior to soldering to a printed circuit board while improving BLR of an electronic system once the electronic device is soldered to a host printed circuit board. The described examples provide a reliability improvement compared to post mold plating of matte tin directly on bare copper and provides a solution that has a low manufacturing cost without using expensive plating alternatives, such as electroless plating of nickel phosphide and gold (e.g., NiP and Au).

The above examples are merely illustrative of several possible implementations of various aspects of the present disclosure, wherein equivalent alterations and/or modifications will occur to others skilled in the art upon reading and understanding this specification and the annexed drawings.

What is claimed is:

1. An electronic device, comprising:
a semiconductor die;
a package structure enclosing the semiconductor die; and
a conductive lead having a first surface and a second surface, the first surface having a bilayer exposed outside the package structure along a side of the package structure, and the second surface exposed outside the package structure along another side of the package structure, the bilayer including a first plated layer and a second plated layer, the first plated layer on and contacting the first surface of the conductive lead, the second plated layer on and contacting the first plated layer and exposed outside the package structure along the side of the package structure, the first plated layer including nickel tungsten, and the second plated layer including tin.

2. The electronic device of claim 1, wherein the first plated layer has a thickness of approximately 0.1 µm or more and approximately 2.0 µm or less.

3. The electronic device of claim 2, wherein the second plated layer has a thickness of approximately 3.0 µm or more and approximately 12.0 µm or less.

4. The electronic device of claim 3, wherein the first plated layer has a thickness of approximately 0.5 µm or more and approximately 2.0 µm or less.

5. The electronic device of claim 3, wherein the first plated layer has a thickness of approximately 1.0 µm.

6. The electronic device of claim 1, wherein the first plated layer has a thickness of approximately 0.5 μm or more and approximately 2.0 μm or less.

7. The electronic device of claim 1, wherein the first plated layer has a thickness of approximately 1.0 μm.

8. The electronic device of claim 1, wherein the second plated layer has a thickness of approximately 3.0 μm or more and approximately 12.0 μm or less.

9. A system, comprising:
a circuit board; and
an electronic device, comprising: a semiconductor die; a package structure enclosing the semiconductor die; and a conductive lead electrically coupled to a circuit of the semiconductor die and to a conductive feature of the circuit board, the conductive lead having a first surface and a second surface, the first surface having a bilayer exposed outside the package structure along a side of the package structure, and the second surface exposed outside the package structure along another side of the package structure, the bilayer including a first plated layer and a second plated layer, the first plated layer on and contacting the first surface of the conductive lead, the second plated layer on and contacting the first plated layer and exposed outside the package structure along the side of the package structure, the first plated layer including nickel tungsten, and the second plated layer including tin.

10. The system of claim 9, wherein the first plated layer has a thickness of approximately 0.1 μm or more and approximately 2.0 μm or less.

11. The system of claim 9, wherein the second plated layer has a thickness of approximately 3.0 μm or more and approximately 12.0 μm or less.

12. The system of claim 9, wherein the first plated layer has a thickness of approximately 0.5 μm or more and approximately 2.0 μm or less.

13. The system of claim 9, wherein the first plated layer has a thickness of approximately 1.0 μm.

14. A method of fabricating an electronic device, the method comprising:
performing a first plating process that forms a first plated layer on a first surface of a conductive lead exposed along a side of a molded structure in a panel array of prospective electronic devices, the first plated layer including nickel tungsten;
performing a second plating process that forms a second plated layer on the first plated layer, the second plated layer including tin; and
performing a package separation process that separates an electronic device from the panel array, with the conductive lead exposed along the side of a respective package structure, the package separation process exposing a second surface of the conductive lead along a first side of the package structure.

15. The method of claim 14, further comprising:
before performing the first plating process, performing an activation process on the first surface of the conductive lead using methane sulfonic acid at approximately 10% volume in water.

16. The method of claim 15, wherein the first plating process is an electroplating process that forms the first plated layer to a thickness of approximately 0.1 μm or more and approximately 2.0 μm or less on the first surface of the conductive lead.

17. The method of claim 14, wherein the second plating process is an electroless plating process that forms the second plated layer on the first plated layer to a thickness of approximately 3.0 μm or more and approximately 12.0 μm or less.

18. The method of claim 14, wherein the first plating process is an electroplating process that forms the first plated layer to a thickness of approximately 0.1 μm or more and approximately 2.0 μm or less on the first surface of the conductive lead.

19. The method of claim 14, wherein the first plating process is an electroplating process that forms the first plated layer to a thickness of approximately 0.5 μm or more and approximately 2.0 μm or less on the first surface of the conductive lead.

20. The method of claim 14, wherein the first plating process is an electroplating process that forms the first plated layer to a thickness of approximately 1.0 μm on the first surface of the conductive lead.

* * * * *